(12) United States Patent
Rueckes et al.

(10) Patent No.: US 6,944,054 B2
(45) Date of Patent: Sep. 13, 2005

(54) NRAM BIT SELECTABLE TWO-DEVICE NANOTUBE ARRAY

(75) Inventors: Thomas Rueckes, Boston, MA (US); Brent M. Segal, Woburn, MA (US); Bernhard Vogeli, Boston, MA (US); Darren K. Brock, Elmsford, NY (US); Venkatachalam C. Jaiprakash, Fremont, CA (US); Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 10/810,962

(22) Filed: Mar. 26, 2004

(65) Prior Publication Data

US 2005/0041465 A1 Feb. 24, 2005

Related U.S. Application Data

(60) Provisional application No. 60/459,223, filed on Mar. 28, 2003.

(51) Int. Cl.[7] .............................................. G11C 11/34
(52) U.S. Cl. ........................ 365/177; 365/163; 257/415
(58) Field of Search ................................. 365/177, 163; 257/415

(56) References Cited

U.S. PATENT DOCUMENTS

| 6,128,214 | A | 10/2000 | Kuekes et al. |
|---|---|---|---|
| 6,159,620 | A | 12/2000 | Heath et al. |
| 6,183,714 | B1 | 2/2001 | Smalley et al. |
| 6,198,655 | B1 | 3/2001 | Heath et al. |
| 6,221,330 | B1 | 4/2001 | Moy et al. |
| 6,232,706 | B1 | 5/2001 | Dai et al. |
| 6,445,006 | B1 | 9/2002 | Brandes et al. |
| 6,518,156 | B1 | 2/2003 | Chen et al. |
| 6,548,841 | B2 | 4/2003 | Frazier et al. |
| 6,559,468 | B1 | 5/2003 | Kuekes et al. |
| 6,574,130 | B2 | 6/2003 | Segal et al. |
| 6,586,787 | B1 | * 7/2003 | Shih et al. .................. 365/163 |
| 6,643,165 | B2 | 11/2003 | Segal et al. |
| 6,673,424 | B1 | 1/2004 | Lindsay et al. |
| 6,706,402 | B2 | 3/2004 | Rueckes et al. |
| 6,750,471 | B2 | 6/2004 | Bethune et al. |
| 6,759,693 | B2 | 7/2004 | Vogeli et al. |
| 6,774,052 | B2 | 8/2004 | Vogeli et al. |
| 6,781,166 | B2 | 8/2004 | Lieber et al. |
| 6,784,028 | B2 | 8/2004 | Rueckes et al. |
| 6,803,840 | B2 | 10/2004 | Hunt et al. |
| 6,809,465 | B2 | 10/2004 | Jin |
| 2002/0130311 | A1 | 9/2002 | Lieber et al. |
| 2002/0130353 | A1 | 9/2002 | Lieber et al. |

(Continued)

FOREIGN PATENT DOCUMENTS

| WO | WO 01/03208 A1 | 1/2001 |
|---|---|---|
| WO | WO 01/44796 A1 | 6/2001 |
| WO | WO 04/065657 | 8/2004 |

OTHER PUBLICATIONS

Ajayan, P.M., et al., "Nanometre–size tubes of carbon." *Rep. Prog. Phys.*, *1997*, vol. 60, 1025–1062.

Ami, S. et al., "Logic gates and memory cells based on single $C_{60}$ electromechanical transistors." *Nanotechnology*, *2001*, vol. 12, 44–52.

Avouris, P., "Carbon nanotube electronics," *Chem. Physics*, *2002*, vol. 281, pp. 429–445.

(Continued)

*Primary Examiner*—Huan Hoang
(74) *Attorney, Agent, or Firm*—Wilmer Cutler Pickering Hale and Dorr LLP

(57) ABSTRACT

A non-volatile memory array includes a plurality of memory cells, each cell receiving a bit line, word line, and release line. Each memory cell includes a cell selection transistor and a restore transistor with first, second and third nodes. Each cell further includes an electromechanically deflectable switch, the position of which manifests the logical state of the cell. Each cell is bit selectable for read and write operations.

11 Claims, 2 Drawing Sheets

U.S. PATENT DOCUMENTS

| | | | |
|---|---|---|---|
| 2002/0172963 A1 | | 11/2002 | Kelley et al. |
| 2002/0179434 A1 | | 12/2002 | Dai et al. |
| 2003/0021966 A1 | | 1/2003 | Segal et al. |
| 2003/0124325 A1 | | 7/2003 | Rueckes et al. |
| 2003/0165074 A1 | | 9/2003 | Segal et al. |
| 2003/0206436 A1 | * | 11/2003 | Eaton et al. ............... 365/177 |
| 2003/0234407 A1 | | 12/2003 | Vogeli et al. |
| 2003/0236000 A1 | | 12/2003 | Vogeli et al. |
| 2004/0085805 A1 | | 5/2004 | Segal et al. |
| 2004/0159833 A1 | | 8/2004 | Rueckes et al. |
| 2004/0164289 A1 | | 8/2004 | Rueckes et al. |
| 2004/0175856 A1 | | 9/2004 | Jaiprakash et al. |
| 2004/0181630 A1 | | 9/2004 | Jaiprakash et al. |
| 2004/0191978 A1 | | 9/2004 | Rueckes et al. |
| 2004/0214366 A1 | | 10/2004 | Segal et al. |
| 2004/0214367 A1 | | 10/2004 | Segal et al. |
| 2005/0041466 A1 | | 2/2005 | Rueckes et al. |
| 2005/0047244 A1 | | 3/2005 | Rueckes et al. |
| 2005/0056877 A1 | | 3/2005 | Rueckes et al. |

OTHER PUBLICATIONS

Casavant, M.J. et al., "Neat macroscopic membranes of aligned carbon nanotubes," *Journal of Appl. Phys., 2003*, vol. 93(4) 2153–2156.

Choi, W. B. et al., "Carbon–nanotube–based nonvolatile memory with oxide–nitride–film and nanoscale channel." *Appl. Phys. Lett., 2003*, vol. 82(2) 275–277.

Cui, J.B. et al., "Carbon Nanotube Memory Devices of High Charge Storage Stability." *Appl. Phys. Lett., 2002*, vol. 81(17) 3260–3262.

Dai, H. et al., "Controlled Chemical Routes to Nanotube Architectures, Physics, and Devices." *J. Phys. Chem . B, 1999*, vol. 103, 111246–11255.

Dehon, A., "Array–Based Architecture for FET–Based, Nanoscale Electronics." *IEEE Transactions on Nanotechnology, 2003*, vol. 2(1) 23–32.

Dequesnes, M. et al., "Calculation of pull–in voltages for carbon–nanotube–based nanoelectromechanical switches." *Nanotechnology, 2002*, vol. 13, 120–131.

Dequesnes, M. et al., "Simulation of carbon nanotube–based nanoelectromechanical switches." *Computational Nanoscience and Nanotechnology, 2002*, 383–386.

Fan, S. et al., "Carbon nanotube arrays on silicon substrates and their possible application." *Physica E, 2000*, vol. 8, 179–183.

Farajian, A. A. et al., "Electronic transport through bent carbon nanotubes: Nanoelectromechanical sensors and switches." *Phys. Rev. B, 2003*, vol. 67, 205423–1–205423–6.

Fischer, J.E. et al., "Magnetically aligned single wall carbon nanotube films: Preferred orientation and anisotropic transport properties." *Journal of Appl. Phys., 2003*, vol. 93(4) 2157–2163.

Franklin, N. R. et al., "Integration of suspended carbon nanotube arrays into electronic devices and electromechanical systems." *Appl. Phys. Lett., 2002*, vol. 81(5) 913–915.

Fuhrer, M.S. et al., "High–Mobility Nanotube Transistor Memory." *Nano Letters, 2002*, vol. 2(7) 755–759.

Homma, Y. et al., "Growth of Suspended Carbon Nanotubes Networks on 100–nm–scale Silicon Pillars." *Appl. Phys. Lett., 2002*, vol. 81(12) 2261–2263.

Kinaret, J.M. et al., "A carbon–nanotube–based nanorelay", *Appl. Phys. Lett., 2003*, vol. 82(8) 1287–1289.

Lee, K.H. et al., "Control of growth orientation for carbon nanotubes." *Appl. Phys. Lett., 2003*, 82 (3) 448–450.

Radosavljevic, M. et al., "Nonvolatile molecular memory elements based on ambipolar nanotube field effect transistors." *Nano Letters, 2002*, vol. 2(7) 761–764.

Robinson, L.A.W., "Self–Aligned Electrodes for Suspended Carbon Nanotube Structures." *Microelectronic Engineering, 2003*, vol. 67–68, 615–622.

Rueckes, T., et al., "Carbon Nanotube–Based Nonvolatile Random Access Memory for Molecular Computing" *Science, 2000*, vol. 289, 94–97.

Soh, H. T. et al., "Integrated nanotube circuits: Controlled growth and ohmic contacting of single–walled carbon nanotubes." *Appl. Phys. Lett., 1999*, vol. 75(5) 627–629.

Sreekumar, T.V., et al., "Single–wall Carbon Nanotube Films", *Chem. Mater. 2003*, vol. 15, 175–178.

Tans, S. et al., "Room–temperature transistor based on a single carbon nanotube." *Nature, 1998*, vol. 393, 49–52.

Tour, J. M. et al., "NanoCell Electronic Memories." *J. Am. Chem Soc., 2003*, vol. 125, 13279–13283.

Verissimo–Alves, M. et al., "Electromechanical effects in carbon nanotubes: *Ab initio* and analytical tight–binding calculations." *Phys. Rev. B, 2003*, vol. 67, 161401–1–161401–4.

Wolf, S., Silicon Processing for the VLSI Era; vol. 2—Process Integration, Multi–Level–Interconnect Technology for VLSI and ULSI, 1990, Section 4.3 Materials for Multilevel Interconnect Technologies, pp. 189–191, Lattice Press, Sunset Beach.

Wolf, S., Silicon Processing for the VLSI Era; vol. 2—Process Integration, 1990, Section 4.7 Manufacturing Yield and Reliability Issues of VLSI Interconnects, pp. 260–273, Lattice Press, Sunset Beach.

Zhan, W. et al., "Microelectrochemical Logic Circuits." *J. Am. Chem. Soc., 2003*, vol. 125, 9934–9935.

\* cited by examiner

OFF STATE

ON STATE

NRAM BIT SELECTABLE TWO-DEVICE NANOTUBE ARRAY

CROSS-REFERENCE TO RELATED APPLICATIONS

This application claims priority under 35 U.S.C. § 119(e) to U.S. Provisional Apl. Ser. No. 60/459,223, filed on Mar. 28, 2003, entitled NRAM BIT SELECTABLE TWO-DEVICE NANOTUBE ARRAY, which is expressly incorporated herein by reference in its entirety.

This application is related to the following U.S. applications, the contents of which are incorporated herein in their entirety by reference:

U.S. Provisional Apl. Ser. No. 60/459,222 filed on Mar. 28, 2003, entitled NRAM Bit Selectable One-Device Nanotube Array; and U.S. patent application Ser. No. (inserted upon USPTO designation), filed on the same day as the present application, entitled Non-Volatile Ram Cell And Array Using Nanotube Switch Position For Information State.

U.S. Provisional Patent Application No. 60/459,253, filed on Mar. 28, 2003, entitled Single Transistor with Integrated Nanotube (NT-FET); and U.S. patent application Ser. No. (inserted upon USPTO designation), filed on the same day as the present application, entitled A Four Terminal Non-Volatile Transistor Device.

U.S. Provisional Patent Application No. 60/459,224, filed on Mar. 28, 2003, entitled Nanotube-on-Gate FET Structures and Applications; and U.S. patent application Ser. No. (inserted upon USPTO designation), filed on the same day as the present application, entitled Nanotube-on-Gate FET Structures and Applications.

BACKGROUND

1. Technical Field

The invention relates to non-volatile RAM structures and more specifically to non-volatile structures using nanotube electromechanical (NT) switches to provide unit cells that may be employed in integrated circuits.

2. Discussion of Related Art

Important characteristics for a memory cell in electronic devices include low cost, non-volatility, high density, low power, and high speed. Conventional memories exhibit some, but not all, of these important characteristics. Examples of conventional memories include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM). Some of the difficulties found within conventional memories are the following.

ROM is relatively low cost but cannot be rewritten. PROM can be electrically programmed, but PROM can be only be programmed once. EPROM maintains fast read cycles relative to ROM and PROM. However, EPROM exhibits a reliability limited to a few iterative read/write cycles and long erase times. EEPROM has low power consumption and is inexpensive, but has long write cycles (ms) and slow speed relative to DRAM or SRAM. Flash memory is faster than EEPROM but still incurs the same detriments as EEPROM. Flash memory also has a finite number of read/write cycles giving rise to low long-term reliability.

ROM, PROM, EPROM and EEPROM are all non-volatile memories. Non-volatile memory retains information stored in the memory cells, if an interruption in power occurs.

DRAM stores charge on transistor gates that act as capacitors, but DRAM must be electrically refreshed every few milliseconds thereby complicating system design by requiring separate circuitry to refresh the memory contents before the capacitors discharge.

SRAM is faster than DRAM and does not need to be refreshed. Yet, SRAM has lower density and higher cost than DRAM. Both SRAM and DRAM are volatile memories. Volatile memory loses information stored in the memory cells, if an interruption in power occurs.

Existing memory technologies can be classified into two categories, volatile and non-volatile. Non-volatile memories are not randomly accessible and do not support multiple writes with any high degree of reliability. In addition, non-volatile memories have low density and high cost. Volatile memories have either complicated system design or have low density.

Emerging technologies have attempted to address these shortcomings. Magnetic RAM (MRAM) or ferromagnetic RAM (FRAM) utilizes the orientation of magnetization or a ferromagnetic region to generate a non-volatile memory cell. Both of these types of memory cells have high magneto-resistance and low density.

MRAM utilizes a magneto-resistive memory element involving the anisotropic magneto-resistance or giant magneto-resistance of ferromagnetic materials to achieve a non-volatile memory cell. A different memory cell based upon magnetic tunnel junctions has also been examined but has not led to large-scale commercialized MRAM devices.

FRAM uses a circuit architecture similar to DRAM by storing charge on a capacitor. A thin film ferroelectric capacitor retains an electrical polarization after an externally applied electric field is removed. The retention in polarization yields a nonvolatile memory cell. FRAM suffers from a large memory cell size, and it is difficult to manufacture as a large-scale integrated component.

Phase change memory is another non-volatile memory. Phase change memory stores within the states of the lattice (i.e., atomic structure) of thin-film alloys containing elements, such as, selenium or tellurium. These alloys remain stable in both crystalline and amorphous states allowing the formation of a bi-stable switch. Unfortunately, phase change memory suffers from slow operations and questionable reliability. Phase change memory is also difficult to manufacture and, consequently, has not been commercialized.

Another memory technology being explored is molecular wire crossbar memory (MWCM). MWCM researchers envision using molecules as bi-stable switches. A thin layer (a few atoms thick) of molecular compounds is sandwiched between two wires (metal or semiconductor). Chemical assembly techniques are used to precisely synthesize the atomic layer. Chemical assembly techniques exploits non-equilibrium conditions of chemical reactions between external reagents and surface functional groups. Electrochemical oxidation/reduction (ox/redox) is used in conjunction with chemical assembly techniques to generate an on or off state. Inherent within redox processes, this form of memory can be unstable (volatile) and requires highly specialized wire junctions.

Recently, memory devices have been proposed which use nanoscopic wires, such as single-walled carbon nanotubes, to form crossbar junctions to serve as memory cells. See PCT patent application No. WO 01/03208 entitled "Nanoscopic Wire-Based Devices, Arrays, and Methods of Their Manufacture" and "Carbon Nanotube-Based Nonvolatile Random Access Memory for Molecular Computing," published in Science, vol. 289, pp. 94–97, 7 Jul., 2000.

The above identified references describe individual single-walled nanotube (SWNT) wires suspended over other wires to define memory cells. Responsive to electrical signals, the wires physically attract or repel one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

Nanotube wire crossbar memories (NTWCMs) rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown.

The ideal memory for at least some purposes is one which would offer low cost per bit, high density, fast random access, read/write cycle times of equal duration, low power consumption, operation over a wide temperature range, a single low-voltage power supply, with a high degree of radiation tolerance. The non-volatile described herein cell offers high speed read, but also high speed write (nanosecond) vs. the slow (microsecond & millisecond) write time of EEPROM and FLASH EEPROM type of memories. The memory is much denser than conventional SRAM because it has a two device, NT and 3 array line structure, and offers competitive performance. The density is less than that of DRAM cells, however, the product offers NDRO operation and non-volatility.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY OF THE INVENTION

The invention provides a bit-selectable non-volatile RAM cell and array using nanotube switch position for information state.

According to one aspect of the invention a non-volatile bit addressable memory array has a plurality of memory cells, each cell having a first control circuit having a transistor and receiving a bit line signal and word line signal, the first control circuit communicates with a select node based on the bit line signal and word line signal. Each cell further includes a second control circuit having a transistor and receiving the bit line signal and a release line signal, the second control circuit communicates with a restore node based on the bit line signal and a release line signal; and an electromechanically deflectable three terminal switch. The three terminal switch has a first terminal connected to the select node; a second terminal connected to the restore node; and a third terminal connected to a reference signal and a deflectable nanotube article. The nanotube article is electromechanically deflectable to contact the select node when a predetermined voltage difference is applied between the first and third terminals and is releasable from such contact when a predetermined voltage difference is applied between the second and third terminals.

According to another aspect of the invention, the nanotube article is a ribbon of nanotube fabric.

According to another aspect of the invention, each ribbon of nanotube fabric includes a plurality of carbon nanotubes.

According to another aspect of the invention, the nanotube fabric is porous.

According to another aspect of the invention, the nanotube fabric is substantially a monolayer of carbon nanotubes.

According to another aspect of the invention, the nanotube fabric is formed of single-walled carbon nanotubes.

According to another aspect of the invention, the first control circuit is a FET receiving the bit line signal on a drain node and the word line signal on the gate node, and wherein the source is in electrical communication with the first terminal of the three terminal switch.

According to another aspect of the invention, the second control circuit is a FET receiving the bit line signal on a drain node and the release line signal on the gate node, and wherein the source is in electrical communication with the second terminal of the three terminal switch.

According to another aspect of the invention, the first control circuit is a first FET receiving the bit line signal on a drain node and the word line signal on the gate node, and wherein the source is in electrical communication with the first terminal of the three terminal switch, and wherein the second control circuit is a second FET receiving the bit line signal on a drain node and the release line signal on the gate node, and wherein the source is in electrical communication with the second terminal of the three terminal switch, and wherein adjacent memory cells are arranged such that the bit line connection is shared between the first and second FETs of adjacent cells.

DETAILED DESCRIPTION

Preferred embodiments of the invention provide a non-volatile ram cell and array structure in which information state is manifested by the physically deflected position of a nanotube (NT) switching element. The non-volatile ram cells are bit selectable for read and write operations. The NT switching component has two states: an On state and an Off state. The NT element may be caused to deflect to one state or the other through transistor interface circuitry; that is, the surrounding circuit does not access the NT element directly but instead accesses transistor devices to set or release the NT element from one state or the other.

Figure 1A:
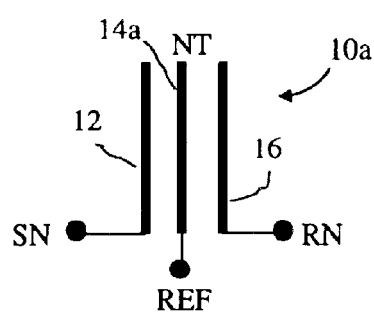
FIG. 1a is a representation of NT structure in the Off state.

FIGS. 1A and B depict an NT switching element. The devices include a set node 12 a release node 16 and a nanotube element positioned in between. The NT element generally extends perpendicularly to the nodes 12 and 16. In preferred embodiments the NT element is formed from a fabric of nanotubes, as is described further below. The NT element in these embodiments is electrically connected to a reference voltage REF. By applying a proper signal to the set (or select) node 12 the NT element may be caused to electromechanically deflect into contact with the node, as is shown by deflected element 14b in FIG. 1b. A different signal on node 12 will keep the NT element in an undeflected state as is shown by undeflected element 14a shown in FIG. 1a. Applying a proper signal to the release node 16 will release the NT element from contact with the set node 12 and place the element in the undeflected state.

As shown in FIG. 1a, the Off state 10a has an un-deflected NT 14a, resulting in an open circuit (i.e., high impedance in the range of one or more mega-ohms) between NT 14a and select electrode 12 connected to terminal SN, and release electrode 16 connected to node RN. Typically, the Off state open circuit impedance is at least ten times higher than the On state closed circuit impedance. In this Off state, a small capacitance exists between NT 14a and select electrode 12 and release electrode 16.

The NT 14a switching component toggles from Off to On (near-ohmic) state when a select voltage (typically in the range of 0.25 to 2 volt) is applied between a select electrode SN and a reference electrode REF connected to the NT 14a. A resultant force is applied to NT 14a due to an electrostatic attraction between NT 14a and select node 12.

Figure 1B:
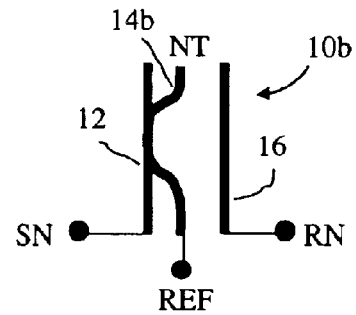
FIG. 1b is a representation of NT structure in the On state.

In the ON state 10b as shown in FIG. 1b, NT 14b is flexed and held in close proximity to a select node (electrode) by van der Waal forces, resulting in an ohmic resistance in the 1,000 to 100,000 ohm range between NT 14b and select node 12. The OFF state is restored when a restore voltage, typically in the range of 0.5 to 5 volts, is applied between a restore node RN and a reference electrode REF connected to the NT. A resultant force is applied to NT 14b due to an electrostatic attraction between NT 14b and reference node 16. In one or more embodiments, voltages of the same polarity can be applied to the select node 12 and the reference electrode REF. The resulting repulsion of NT 14b from the select node 12 is used in conjunction with the voltage applied between the reference electrode REF and restore node RN.

The ON and OFF states are non-volatile, i.e., the NT maintains its current state even after removing the electrical power. NT electrical characteristics are described in Thomas Rueckes et al., "Carbon Nanotube-Based Nonvolatile Random Access Memory for Molecular Computing," Science, vol. 289, pp. 94–97, 7 Jul., 2000.

Figure 2:
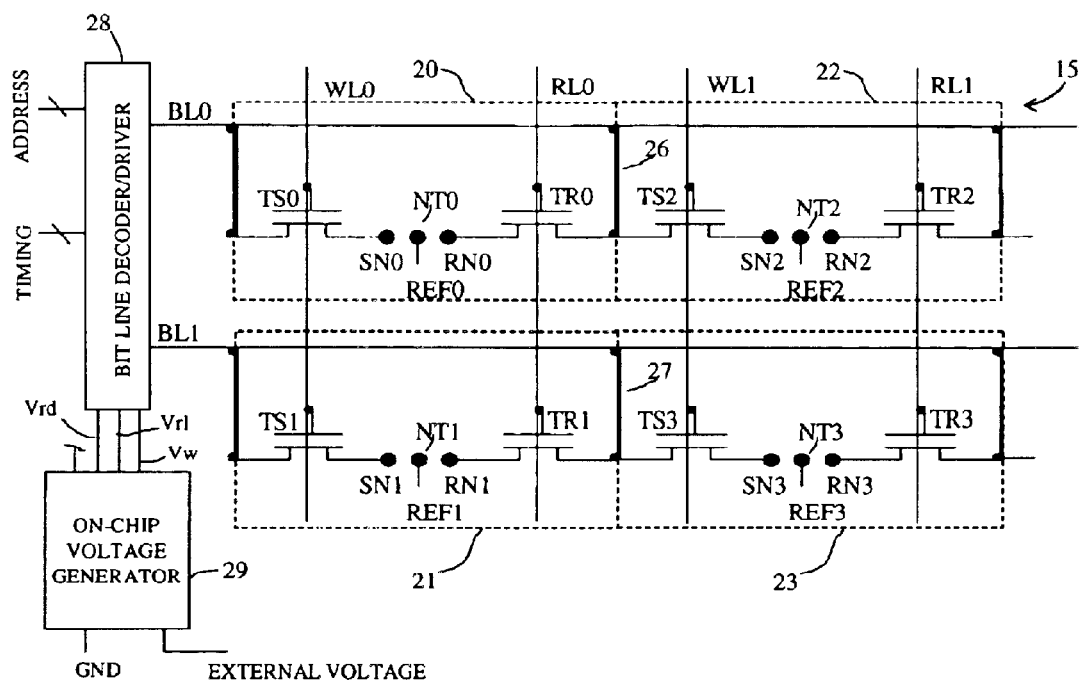
FIG. 2 is an illustration of a memory array with each cell comprising two select FETs and an NT structure.

In one embodiment, an NT switching component forms a non-volatile storage cell when integrated with two NFET transistors in a memory array system as illustrated in FIG. 2. The memory array 15 includes a matrix of non-volatile storage cells 20 through 23. Memory array 15 also includes read and write word lines (WL0, WL1, etc.), release lines (RL0, RL1, etc.), and read and write bit lines (BL0, BL1, etc.). A word line generator (not shown) provides word line signals to the memory cells. A release line generator (not shown) provides release lines to the memory cells. A bit line generator provides bit line signals to the memory cells.

The bit line generator includes a bit line decoder/driver 28 and an on-chip voltage generator 29. The decoder/driver 28 is used to select bit lines to be activated. The bit lines are selected based on the address inputs and timing inputs. The on-chip voltage generator 29 generates the applied bit line voltage levels. Vrd is the read voltage, and Vw is the write voltage. The Release Line Decoder/Driver (not shown) is used to select release lines to be activated. The On-Chip Voltage Generator 29 generates the applied release line voltage level Vrl.

Non-volatile cell 20, as with all the other cells of the present embodiment, comprises select transistor TS0, release transistor TR0, and the nanotube structure. The nanotube structure comprises nanotube element NT0, select node SN0, and release node RN0. The gate of select transistor TS0 communicates with word line WL0. The drain of select transistor TS0 communicates with bit line BL0. The source of select transistor TS0 is connected to select node SN0. Nanotube structure NT0 is tied to REF0 (typically ground). The gate of restore transistor TR0 communicates with release line RL0. The drain of restore transistor TR0 communicates with bit line BL0 via electrode 26. Electrode 26 also connects the drain of select transistor TS2 of cell 22 to BL0. The source of release transistor TR0 is connected to restore node RN0.

For a write operation (to cell 20, as an example), the nanotube structure NT0 is first reset to be in the Off state (10b of FIG. 1b). To do this for this particular cell, a voltage Vh is applied to release line RL0, and a voltage Vrl is concurrently applied to bit line BL0. Voltage Vh is sufficiently greater than restore transistor's TR0 threshold voltage Vth such that voltage Vrl is applied to restore node RN0 through the restore transistor's TR0 channel. The voltage thus created at the source of TR0 (and thus node RN0) creates an electrostatic force to deflect the nanotube element NT0 into the Off state. Voltages Vh and Vrl are removed from release line RL0 and bit line BL0, respectively which turns restore transistor TR0 off. After the nanotube structure NT0 is reset, select transistor TS0 is activated by word line WL0. Voltage Vw is applied to bit line BL0 which propagates through the channel of select transistor TS0 to select node SN0. If a "1" is being written, the corresponding applied high voltage Vw (now between select nodes SN0 and REF0, e.g., ground) will force the nanotube structure to deflect to the On state as previously depicted in FIG 1b. The near-ohmic connection between select node SN0 and reference node REF0 represents the ON state. If a "0" is being written the corresponding applied voltage Vw is too small (e.g., zero) to cause such deflection to node SN0, and the cell remains in the Off state.

A release operation for a particular, single cell does not disturb other cells in the array. For example, during release of cell 21, release transistor TR1 is activated by release line RL0. Release line RL0 also activates release transistor TR0 of cell 20. However, because bit line BL0 is typically set to zero volts during the release of cell 21, cell 20 is not released or disturbed. Thus, as stated above, individual cells may be released (and thus written).

For a read operation (from cell 20, as an example), bit line BL0 is driven high and allowed to float. Word line WL0 is driven to high voltage Vh which turns on select transistor TS0. If cell 20 is in the On state (FIG. 1b), a conductive path exists between select node SN0 and reference node REF0. The bit line voltage Vrd decreases as the bit line discharges through select transistor TS0 and select node SN0, and on to reference node REF0. If, however, cell 20 is in the Off state (FIG. 1a), then the path from BL0 through TS0 to SN0 will indicate a high impedance (high mega ohm or gig ohm or at least ten times higher impedance than the On state impedance) relative to REF0, and the bit line voltage Vrd will remain relatively unchanged. The sense amplifier/latch circuit (not shown) detects changes in bit line BL0 voltage. If the voltage Vrd on bit line BL0 has decreased (i.e., if the sense amplifier/latch circuit detects that the voltage Vrd has decayed to below a predetermined threshold value), the latch is set to a logic "1" state. If the voltage Vrd is relatively unchanged, then the latch is set to a logic "0" state. The read operation is a nondestructive read out (NDRO) of the cell information. No write back/regeneration cycle is necessary. Also, if external power is lost, the array preserves the stored information (i.e., nonvolatile storage).

Figure 3:
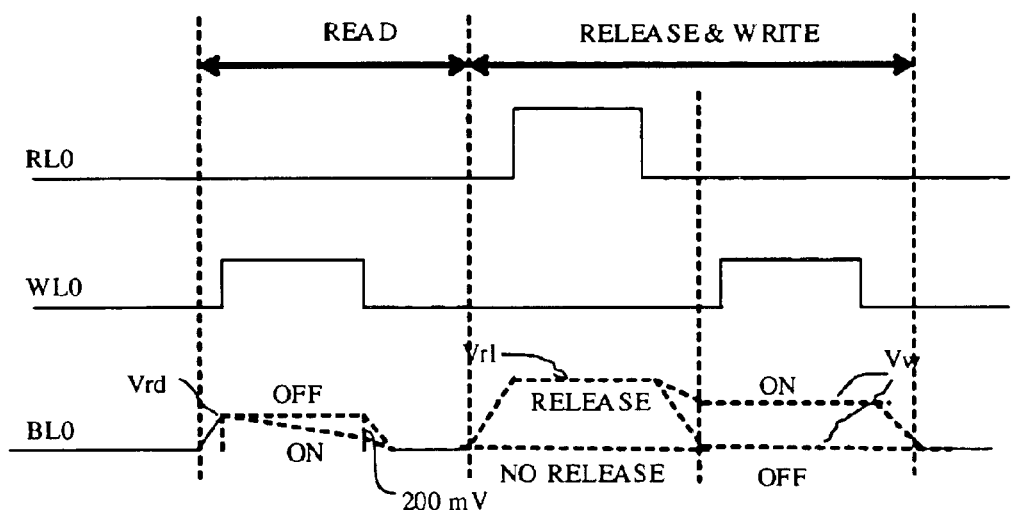
FIG. 3 is an illustration of the operational waveforms of a memory array with each cell comprising two select FETs and an NT structure.

FIG. 3 illustrates the operational waveforms of FIG. 2 during the read and release and write operations. During the read operation, cell 20 is selected by charging bit line BL0 to a voltage Vrd in the 0.5 to 2 volt range, and driving WL0 high. If the cell is in the Off (logic "0") state, voltage Vrd is relatively unchanged. If the cell is in the On (logic "1") state, then the voltage Vrd decreases over time. The difference in bit line BL0 voltage Vrd between On and Off states is typically 200 mv. This difference can be amplified and latched (not shown).

A write operation is preceded by a release operation, as described above. During release, cell 20 is selected when bit line BL0 is driven to high voltage Vrl, which is typically in the 1 to 5 volt range, and RL0 is driven high. BL0 voltage Vrl is applied through release transistor TR0 to release node RN0. Cell 20 is driven to the OFF state. At the start of the write cycle, cell 20 is in the OFF state (FIG. 1a). Cell 20 is selected when bit line BL0 is driven to voltage Vw, which is typically in the 0.5 to 2 volt range for writing a logical "1" state (cell is On) and WL0 is driven to a high state. If bit line BL0 voltage is zero when word line WL0 is driven to a high state, the cell remains in the Off or logical "0" state.

The NT electromechanical switching components in the described embodiments incorporate a nanofabric component. In at least some cases, the technique chosen to create a nanofabric must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bi-layers or tri-layers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs). The nanofabric is patterned using photolithographic techniques generating an electrically conductive trace of nanotubes.

The following U.S. Patent applications disclose various methods and techniques for making nanotube fabrics and nanotube switching elements that may be used as NT devices of preferred embodiments. The nanotube fabrics are porous and in some instances highly porous. The nanotube fabrics are substantially a monolayer of carbon nanotubes. In certain preferred embodiments, the carbon nanotubes are single-walled carbon nanotubes. Their disclosures are hereby incorporated by reference in their entirety:

"Electromechanical Memory Array Using Nanotube Ribbons and Method for Making Same," U.S. patent application Ser. No. 09/915093, filed Jul. 25, 2001 (NAN-1);

"Electromechanical Three-Trace Junction Devices," U.S. patent application Ser. No. 10/033323, filed Dec. 28, 2001 (NAN-4);

"Nanotube Films And Articles," U.S. patent application Ser. No. 10/128118, filed Apr. 23, 2002 (NAN-6);

"Methods Of Making Carbon Nanotube Films, Layers, Fabrics, Ribbons, Elements And Articles," U.S. patent application Ser. No. 10/341005, filed Jan. 13, 2003 (NAN-15);

"Devices Having Horizontally-Disposed Nanofabric Articles And Methods Of Making The Same," U.S. patent application Ser. No. 10/776,059, filed Feb. 11, 2004 (NAN-19); and "Devices Having Vertically-Disposed Nanofabric Articles And Methods Of Making "The Same," U.S. patent application Ser. No. 10/776,572, filed Feb. 11, 2004 (NAN-20).

Other embodiments may employ double-walled nanotubes, including such nanotubes with metallic properties.

The preferred embodiment uses electrostatic attractive forces to deflect the nanotube element, but other embodiments may use repulsive forces.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A non-volatile bit addressable memory array comprising a plurality of memory cells, each cell having:

a first control circuit having a transistor and receiving a bit line signal and word line signal, the first control circuit communicates with a select node based on the bit line signal and word line signal;

a second control circuit having a transistor and receiving the bit line signal and a release line signal, the second control circuit communicates with a restore node based on the bit line signal and the release line signal; and an electromechanically deflectable three terminal switch comprising:

a first terminal connected to the select node;

a second terminal connected to the restore node; and a third terminal connected to a reference signal and a deflectable nanotube article, the nanotube article being electromechanically deflectable to contact the select node when a predetermined voltage difference is applied between the first and third terminals and being releasable from such contact when a predetermined voltage difference is applied between the second and third terminals.

2. The memory array according to claim 1, wherein the nanotube article is a ribbon of nanotube fabric.

3. The memory array according to claim 2 wherein each ribbon of nanotube fabric includes a plurality of carbon nanotubes.

4. The memory array of claim 2 wherein the nanotube fabric is porous.

5. The memory array of claim 2 wherein the nanotube fabric is substantially a monolayer of carbon nanotubes.

6. The memory array of claim 4 wherein the nanotube fabric is formed of single-walled carbon nanotubes.

7. The memory array of claim 1 wherein informational state of a memory cell is manifested by the position of the deflectable nanotube article and wherein the position of the nanotube switching element is sensed on the bit line as a time variation of the bit line signal.

8. The memory array of claim 1 wherein the first control circuit is a FET receiving the bit line signal on a drain node and the word line signal on the gate node, and wherein the source is in electrical communication with the first terminal of the three terminal switch.

9. The memory array of claim 1 wherein the second control circuit is a FET receiving the bit line signal on a drain node and the release line signal on the gate node, and wherein the source is in electrical communication with the second terminal of the three terminal switch.

10. The memory array of claim 1 wherein adjacent memory cells are arranged such that the second control circuit of one cell and the first control circuit of the other cell share a bit line connection.

11. The memory array of claim 1 wherein the first control circuit is a first FET receiving the bit line signal on a drain node and the word line signal on the gate node, and wherein the source is in electrical communication with the first terminal of the three terminal switch, and wherein the second control circuit is a second FET receiving the bit line signal on a drain node and the release line signal on the gate node, and wherein the source is in electrical communication with the second terminal of the three terminal switch, and wherein adjacent memory cells are arranged such that the bit line connection is shared between the first and second FETs of adjacent cells.

* * * * *